(12) United States Patent
Jatkowski et al.

(10) Patent No.: US 7,568,176 B2
(45) Date of Patent: Jul. 28, 2009

(54) METHOD, SYSTEM, AND COMPUTER PROGRAM PRODUCT FOR HIERARCHICAL INTEGRATED CIRCUIT REPARTITIONING

(75) Inventors: Adam R. Jatkowski, Wyoming, PA (US); Robert M. Averill, III, Wappingers Falls, NY (US); Joseph J. Palumbo, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 86 days.

(21) Appl. No.: 11/757,457

(22) Filed: Jun. 4, 2007

(65) Prior Publication Data
US 2008/0301607 A1    Dec. 4, 2008

(51) Int. Cl.
*G06F 17/50* (2006.01)
(52) U.S. Cl. .............................................. 716/7; 716/8
(58) Field of Classification Search ................ 716/7–10
See application file for complete search history.

(56) References Cited

U.S. PATENT DOCUMENTS

| | | | |
|---|---|---|---|
| 6,832,362 B2 * | 12/2004 | Nuber ......................... | 716/12 |
| 7,103,863 B2 | 9/2006 | Riepe et al. | |
| 7,137,097 B1 * | 11/2006 | Aji et al. ...................... | 716/12 |
| 7,143,367 B2 | 11/2006 | Eng | |
| 2004/0078767 A1 | 4/2004 | Burks et al. | |
| 2005/0183054 A1 | 8/2005 | Wein et al. | |
| 2005/0251775 A1 * | 11/2005 | Wood .......................... | 716/10 |
| 2005/0257178 A1 | 11/2005 | Daems et al. | |

* cited by examiner

*Primary Examiner*—Jack Chiang
*Assistant Examiner*—Binh C Tat
(74) *Attorney, Agent, or Firm*—Cantor Colburn LLP; William Kinnaman, Jr.

(57) ABSTRACT

A method, system, and computer program product for hierarchical integrated circuit repartitioning are provided. The method includes receiving parent level placement data for one or more interconnecting elements and designating at least one child to receive a pushdown of the one or more interconnecting elements from the parent level. For each child designated to receive the pushdown of the one or more interconnecting elements, the method further includes determining a physical coverage area of the child, identifying which of the one or more interconnecting elements within the physical coverage area of the child to pushdown into the child, generating an interconnecting element pushdown list for the child, including wiring layer information, and outputting the interconnecting element pushdown list.

14 Claims, 4 Drawing Sheets

METHOD, SYSTEM, AND COMPUTER PROGRAM PRODUCT FOR HIERARCHICAL INTEGRATED CIRCUIT REPARTITIONING

BACKGROUND OF THE INVENTION

The present disclosure relates generally to integrated circuit design tools, and, in particular, to hierarchical integrated circuit repartitioning.

In designing integrated circuits using very large scale integration (VLSI), thousands of transistor-based circuits can be integrated into a single package. A VLSI design may be used for developing a variety of integrated circuits, such as application specific integrated circuits (ASICs), microprocessors, microcontrollers, memory devices, and the like. VLSI designs are typically developed using either a flat or hierarchical physical design. In a flat design, where all circuits are routed at the same level, a design tool can layout a circuit interconnection topology faster due to fewer placement constraints as compared with a hierarchical design employing multiple levels. Another approach to VLSI design is to use a flexible hierarchical design that establishes regional constraints for circuit placement and allows for regions to overlap. Denser VLSI designs that incorporate a larger number of circuits within a single chip often require some form of hierarchical design to fit within the physical dimensions of the chip.

Even though a hierarchical design may be desired for the final design of a VLSI chip, an initial VLSI design often treats circuits within the design as existing within the same level of hierarchy (pseudo-flat), in order to simplify analysis. For example, a design may include a parent level (top level) and one or more child levels. Each level may include multiple entities, such as multiple children entities on the same child level, e.g., a modular design. Timing analysis can be performed faster if the design is initially viewed as existing at a common level, e.g., placing the source and sink pins of children at the same location as the driving and receiving circuit pins of the children (also known as "inboard" pins). Using this approach enables timing analysis to be performed early in the design process, before the full hierarchy is designed. By adding interconnecting elements, such as latches, to a single level of the design, the impact of changes is minimized for various aspects of the design and verification process, e.g., simulation, integration, and timing analysis.

As the design matures, interconnecting elements between children are often placed at the parent level, while driving and receiving circuits are incorporated at the child level. This approach maintains the child level design while only modifying the parent level to adjust for timing and signal drive strength constraints for signals routed between child entities. Since the levels of hierarchy are physically stacked over each other, the parent entity may have very little silicon reservation inside of a child as well as limited use of lower level metal where interconnecting elements are placed and routed. When an edge pin implementation is used for a signal on a child, any signals from overlapping parent entities that enter or exit the child can have extra wire introduced to them. In many cases, the extra wire will degrade the timing and wiring solutions, causing performance to diverge from the original design.

Accordingly, there is a need in the art for repartitioning between parent and child levels in hierarchical integrated circuit design.

BRIEF SUMMARY OF THE INVENTION

An embodiment of the invention includes a method for hierarchical integrated circuit repartitioning. The method includes receiving parent level placement data for one or more interconnecting elements and designating at least one child to receive a pushdown of the one or more interconnecting elements from the parent level. For each child designated to receive the pushdown of the one or more interconnecting elements, the method further includes determining a physical coverage area of the child, identifying which of the one or more interconnecting elements within the physical coverage area of the child to pushdown into the child, generating an interconnecting element pushdown list for the child, including wiring layer information, and outputting the interconnecting element pushdown list.

An additional embodiment includes a method for hierarchical integrated circuit repartitioning. The method includes receiving parent level placement data for one or more interconnecting elements and designating at least one child to receive a pushdown of the one or more interconnecting elements from the parent level. For each child designated to receive the pushdown of the one or more interconnecting elements, the method further includes determining a physical coverage area of the child and expanding the physical coverage area of the child by a user-defined amount. The method also includes identifying which of the one or more interconnecting elements within the physical coverage area of the child to pushdown into the child via tracing between the child and each interconnecting element within the physical coverage area of the child to verify that the child is the only non-interconnecting element connected to one of an input and an output of each interconnecting element, where the verifying results in interconnecting element identification. The method additionally includes generating an interconnecting element pushdown list for the child, including wiring layer information, determining whether any of the identified one or more interconnecting elements are part of a bus, reporting a partial bus pushdown when fewer than all interconnecting elements of the bus are pushed down into a common child, and outputting the interconnecting element pushdown list.

Another embodiment includes a system for hierarchical integrated circuit repartitioning. The system includes a data storage device holding design data for a hierarchical integrated circuit, and a host system in communication with the data storage device, the host system executing a hierarchical integrated circuit repartitioning tool (HICRT). The HICRT receives parent level placement data for one or more interconnecting elements from the design data and designates at least one child to receive a pushdown of the one or more interconnecting elements from the parent level. For each child designated to receive the pushdown of the one or more interconnecting elements, the HICRT determines a physical coverage area of the child, identifies which of the one or more interconnecting elements within the physical coverage area of the child to pushdown into the child, generates an interconnecting element pushdown list for the child, including wiring layer information, and outputs the interconnecting element pushdown list.

A further embodiment includes a computer program product for hierarchical integrated circuit repartitioning. The computer program product includes a storage medium readable by a processing circuit and storing instructions for execution by the processing circuit for implementing a method. The method includes receiving parent level placement data for one or more interconnecting elements and designating at least one child to receive a pushdown of the one or more interconnecting elements from the parent level. For each child designated to receive the pushdown of the one or more interconnecting elements, the method further includes determining a physical coverage area of the child, identifying which of the one or more interconnecting elements within the physical coverage area of the child to pushdown into the child, generating an interconnecting element pushdown list for the child, including wiring layer information, and outputting the interconnecting element pushdown list.

Other systems, methods, and/or computer program products according to embodiments will be or become apparent to one with skill in the art upon review of the following drawings and detailed description. It is intended that all such additional systems, methods, and/or computer program products be included within this description, be within the scope of the present invention, and be protected by the accompanying claims.

BRIEF DESCRIPTION OF THE DRAWINGS

Referring now to the drawings wherein like elements are numbered alike in the several FIGURES.

DETAILED DESCRIPTION OF THE INVENTION

Exemplary embodiments, as shown and described by the various figures and the accompanying text, provide a method, system and computer program product for hierarchical integrated circuit repartitioning. In designing a hierarchical integrated circuit, including physically distinct parent and child levels, interconnecting elements may be initially added at the parent level to simplify simulation and analysis. Examples of interconnecting elements include latches, buffers, clocking structures, and other such elements. Additional interconnecting elements may be added to the design for storage and/or timing purposes, e.g., to account for reduced signal strength or delays associated with long signal paths. As the design matures, it is advantageous to alter the connectivity model such that interconnecting elements on signals traveling over a given entity's boundaries (and to/from the entity) are contained within the entity itself. When an interconnecting element is contained in the same level of hierarchy as a driving or receiving circuit, there is increased flexibility in both the optimal placement of the interconnecting element and the wiring used to get to/from the interconnecting element. In an exemplary embodiment, interconnecting elements are analyzed at the top level (e.g., parent level) of a physical integrated circuit design hierarchy to determine whether one or more interconnecting elements can be "pushed down" to a lower level (e.g., child level). For example, a latch at the parent level may be pushed down to a specific child entity if the latch is in close proximity to the child entity and other conditions are met, as describer in greater detail herein.

Figure 1:
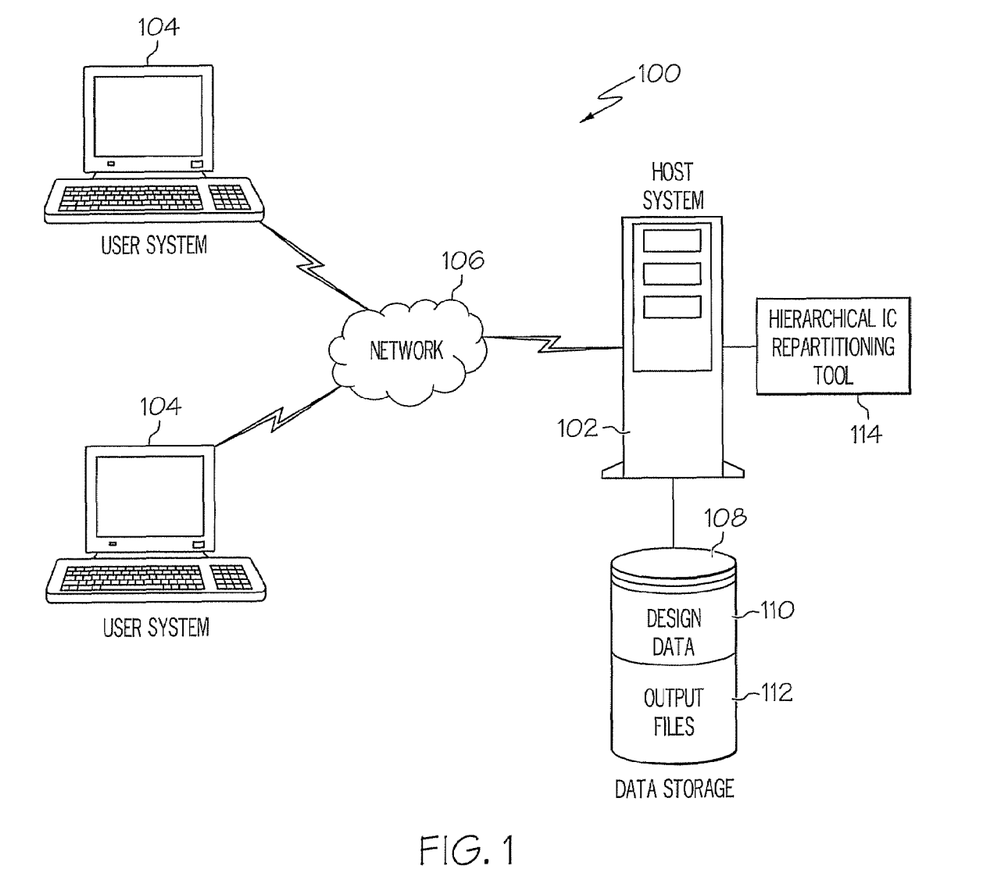
FIG. 1 depicts an exemplary system for hierarchical integrated circuit repartitioning that may be utilized by an exemplary embodiment.

Turning now to the drawings, it will be seen that in FIG. 1 there is a block diagram of a system 100 upon which hierarchical integrated circuit repartitioning is implemented in an exemplary embodiment. The system 100 of FIG. 1 includes a host system 102 in communication with user systems 104 over a network 106. The host system 102 may be a high-speed processing device (e.g., a mainframe computer), including a processing circuit for executing instructions, which handles processing requests from user systems 104. In an exemplary embodiment, the host system 102 functions as an application server and a data management server for integrated circuit design and development activities. User systems 104 may comprise desktop or general-purpose computer devices that generate data and processing requests, such as integrated circuit floor planning, placement, routing, and hierarchical repartitioning requests. While only a single host system 102 is shown in FIG. 1, it will be understood that multiple host systems may be implemented, each in communication with one another via direct coupling or via one or more networks. For example, multiple host systems may be interconnected through a distributed network architecture. The single host system 102 may also represent a cluster of hosts accessing a common data store, e.g., via a clustered file system that is backed by a data storage device 108. In an alternate exemplary embodiment, the host system 102 is directly user accessible without communication through the network 106, e.g., where the host system 102 is embodied in a desktop computer or workstation.

The network 106 may be any type of communications network known in the art. For example, the network 106 may be an intranet, extranet, or an internetwork, such as the Internet, or a combination thereof. The network 106 may include wireless, wired, or fiber optic links.

The data storage device 108 refers to any type of storage and may comprise one or more secondary storage elements, e.g., a hard disk drive or tape storage system that is external to the host system 102. In an alternate exemplary embodiment, the data storage device 108 is internal to the host system 102. Types of data that may be stored in the data storage device 108 include databases and/or files of design data 110, as well as output files 112. It will be understood that the data storage device 108 shown in FIG. 1 is provided for purposes of simplification and ease of explanation and is not to be construed as limiting in scope. To the contrary, there may be multiple data storage devices utilized by the host system 102.

In an exemplary embodiment, the host system 102 executes various applications, including a hierarchical integrated circuit repartitioning tool (HICRT) 114. Other applications, e.g., electronic design automation (EDA) software, business applications, a web server, etc., may also be implemented by the host system 102 as dictated by the needs of the enterprise of the host system 102. The HICRT 114 interacts with databases and/or files stored on the data storage device 108, such as the design data 110, and the HICRT 114 generates the output files 112. In an exemplary embodiment, the design data 110 include hierarchical integrated circuit design and modeling data, such as net lists and placement information for multiple design levels. All or a portion of the HICRT 114 may be located on the user systems 104 with processing shared between the user systems 104 and the host system 102, e.g., a distributed computing architecture. In addition, all or a portion of the data utilized by the HICRT 114 may be located on the user systems 104.

In an exemplary embodiment, the user systems 104 access the host system 102 to request hierarchical integrated circuit repartitioning on the design data 110 while designing a hierarchical integrated circuit. The user systems 104 may also access the host system 102 to create or modify the design data 110 using other EDA software (not depicted). In an exemplary embodiment, the HICRT 114 is capable of analyzing the design data 110 to determine whether interconnecting elements in the design should be repartitioned to a different hierarchical level in the design. The HICRT 114 may be implemented as a stand-alone application, a plug-in, a module, or an executable script in a development environment. In an exemplary embodiment, when the host system 102 receives a request to execute the HICRT 114, the design data 110 is read from the data storage device 108. As described in greater detail herein, the HICRT 114 analyzes the design hierarchy and interconnecting element placement options within the design data 110, producing latch repartitioning results for automating latch placement decisions in a multi-level integrated circuit design, and outputs the results to the output files 112.

Figure 2:
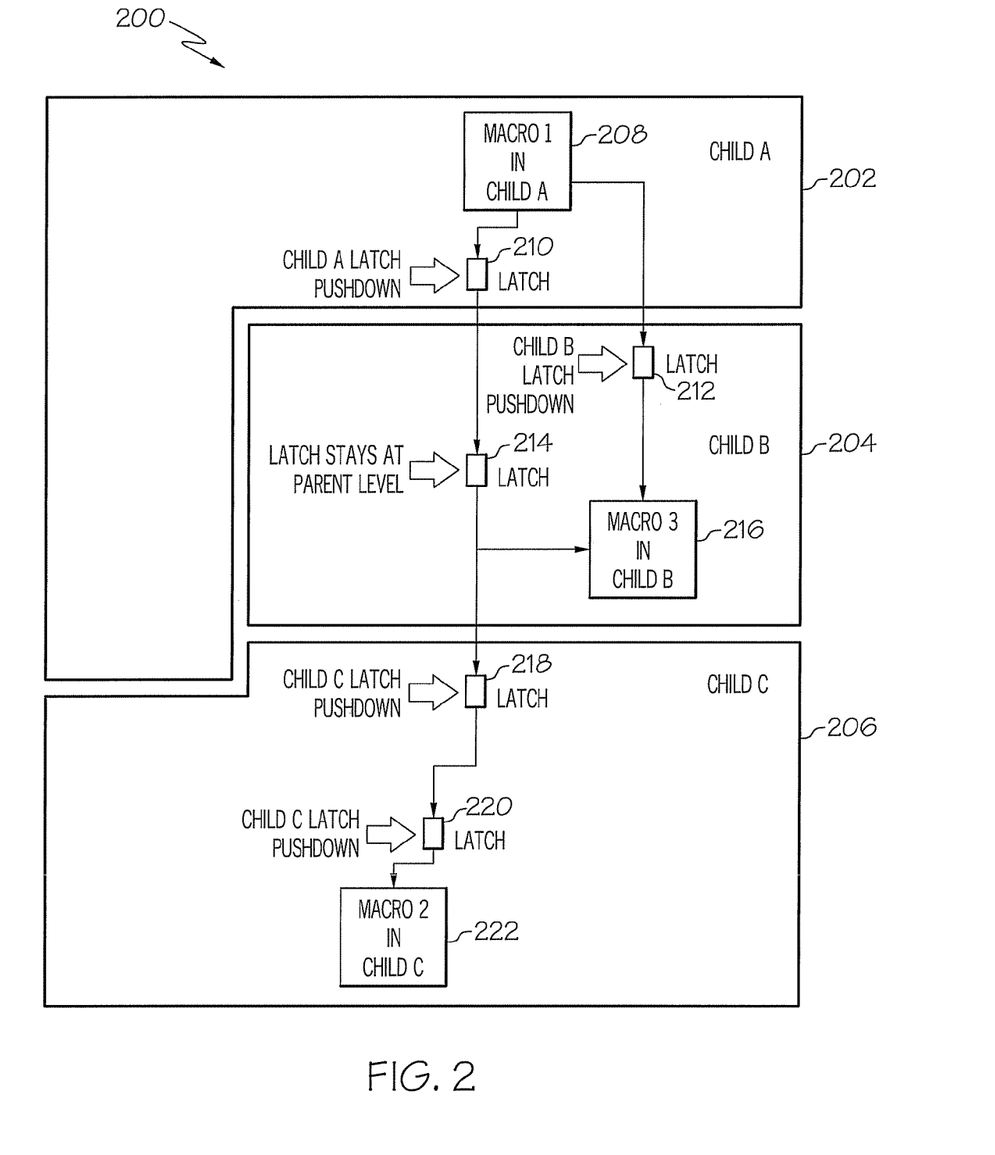
FIG. 2 depicts an exemplary hierarchical structure upon which hierarchical integrated circuit repartitioning may be performed.

Turning now to FIG. 2, an exemplary hierarchical structure 200 of a parent level, child level, and grandchild level for a hierarchical integrated circuit design is depicted as a top view. It will be understood by those skilled in the art that each level in the hierarchical structure 200 is physically stacked over each other such that the parent level is above the child level, and the child level is above the grandchild level, forming a 3-dimensional physical structure as part of an integrated circuit design. The hierarchical structure 200 provides a graphical depiction of a top view for an integrated circuit design that can be generated from the data stored in the design data 110 of FIG. 1, although a graphical depiction need not be generated by exemplary embodiments. In an exemplary embodiment, the hierarchical structure 200 includes a set of child instances, partitioned as child A 202, child B 204, and child C 206. A physical coverage area for the hierarchical integrated circuit design is extracted for each child instance A-C (202-206). The physical coverage area may be defined as a rectilinear polygon, which can be expanded by a user-defined amount. The physical coverage area is depicted in FIG. 2 as the outline surrounding each child instance A-C (202-206). The physical coverage area of the child A 202 includes macro one 208 and a latch 210; however, the macro one 208 is below the child A 202 at the grandchild level, and the latch 210 is initially physically above the child A 202 at the parent level. From a top view perspective, the physical coverage area of the child A 202 establishes a physical area that includes elements that are both physically higher and/or lower than the child level. In an exemplary embodiment, the macro one 208 is a child of child A 202, or a grandchild of the parent level. The latch 210 is an interconnecting element that is initially at the parent level and analyzed by the HICRT 114 of FIG. 1.

The physical coverage area of the child B 204 includes latches 212 and 214, as well as macro three 216; however, the latches 212 and 214 are initially physically above the child B 204 at the parent level, and the macro three 216 is below the child B 204 at the grandchild level. The latches 212 and 214 are interconnecting elements that are initially at the parent level and analyzed by the HICRT 114 of FIG. 1. In an exemplary embodiment, the macro three 216 is a child of child B 204, or a grandchild of the parent level.

The physical coverage area of the child C 206 includes latches 218 and 220, as well as macro two 222; however, the latches 218 and 220 are initially physically above the child C 206 at the parent level, and the macro two 222 is below the child C 206 at the grandchild level. Similar to the other latches of FIG. 2, the latches 218 and 220 are interconnecting elements that are initially at the parent level and analyzed by the HICRT 114 of FIG. 1. The macro two 222 is a child of child C 206, or a grandchild of the parent level.

In an exemplary embodiment, each child instance A-C (202-206) is designated to receive a pushdown from the parent level to the child level of one or more interconnecting elements, e.g. the latches depicted in FIG. 2. For each of the child instances A-C (202-206), the HICRT 114 of FIG. 1 determines the physical coverage area of each child and identifies the one or more interconnecting elements within the physical coverage area. As part of the identification process, the HICRT 114 of FIG. 1 may trace between each child and each interconnecting element within the physical coverage area of the child to verify that the child is the only non-interconnecting element connected to one of an input and an output of each interconnecting element. As used herein, the term "non-interconnecting element" refers to any element that is not an interconnecting element; e.g., a latch is an interconnecting element but a macro is not. For example, tracing between the child A 202 and the latch 210 verifies that within the child A 202 a backward trace from the latch 210 connects to only one non-interconnecting element at the input of the latch 210, i.e., the macro one 208; therefore, the latch 210 can be identified as a pushdown candidate. Similarly, tracing between the child B 204 and the latch 212 verifies that within the child B 204 a forward trace from the latch 212 connects to only one non-interconnecting element at the output of the latch 212, i.e., the macro three 216; therefore, the latch 212 can be identified as a pushdown candidate. Latches 218 and 220 can also be identified for pushing down since a forward trace from both latches 218 and 220 reveals only one non-interconnecting element within the child C 206, i.e., the macro two 222. However, the latch 214 cannot be pushed down because a backward trace from the latch 214 exits the child B 204 and a forward trace connects to both a non-interconnecting element, the macro three 216, and exits the child B 204; therefore, verification through tracing fails, and the latch 214 remains at the parent level.

In an exemplary embodiment, the HICRT 114 of FIG. 1 generates an interconnecting element pushdown list for each child designated to receive at least one pushdown. If the identification process reveals that a designated child does not include at least one pushdown, then a pushdown list need not be generated for that child (e.g., a null/empty list). Each pushdown list can be output individually or aggregated into one or more combined output lists. In an exemplary embodiment, the output files 112 of FIG. 1 represent any output files or reports generated by the HICRT 114 of FIG. 1. An example of the data within the output files 112 of FIG. 1 is as follows.

UNIT PIN sd_ztop fx_sd_norm_spare<0> 1 latches ("b1" "b2") "N15W15S16"

UNIT PIN sd_ztop fx_sd_norm_spare<1> 1 latches ("b1" "b2") "N15W15S16"

UNIT PIN sd_ztop fx_sd_pwr_save 2 latches ("m4" "b1" "b2") "N20W20S14"

UNIT PIN sd_ztop fx_sd_srlz_opcode<0> 2 latches ("b1" "b2") "N15W15S16"

Pushdown information, as provided in the example above, may include particular pin identifiers for net names, a number of interconnecting elements (e.g., latches) to pushdown, and wiring layer information and codes used at the parent level.

Since only a portion of the interconnecting elements for a multi-bit bus may overlap a child in an initial topology, a list can be generated whenever fewer than the full number of bits in a bus is identified to be pushed down to a child. The list can be reviewed, with adjustments made, manually or automatically, so that all or none of the interconnecting elements in the bus are pushed into the child. The output files 112 of FIG. 1 may also include full and partial bus pushdown information as follows.

```
fx_sd_xcond_code<4 TOT: 4 fx_sd_xcond_code<0>
    fx_sd_xcond_code<3> if_sd_dial<11 TOT: 63 if_sd_dial<0> if_sd_dial<62> if_sd_dial_p<1 TOT: 8 if_sd_dial_p<0> if_sd_di-
    al_p<7> if_sd_excp_tags<10 TOT: 10 if_sd_excp_tags<0>
    if_sd_excp_tags<9>
```

In the example above, the output indicates, among other things, the number of bus bits pushed down relative to the number of bits for the bus as "x TOT: y", where "x" represents the number of bits or interconnecting elements pushed down into a common child and "y" represents the bus width. For example, "4 TOT: 4" indicates that all four bits of a four bit bus have been pushed down, while "11 TOT: 63" indicates that only eleven of sixty-three bits of a bus have been pushed down. The output can be further examined by the HICRT 114 of FIG. 1 or manually inspected to take further actions such as blocking a partial bus pushdown by moving the associated pushed down interconnecting elements back to the parent level. Alternatively, the interconnecting elements that were not pushed down into a common child may be pushed down, such that all interconnecting elements of the bus are pushed down into the common child.

Figure 3:
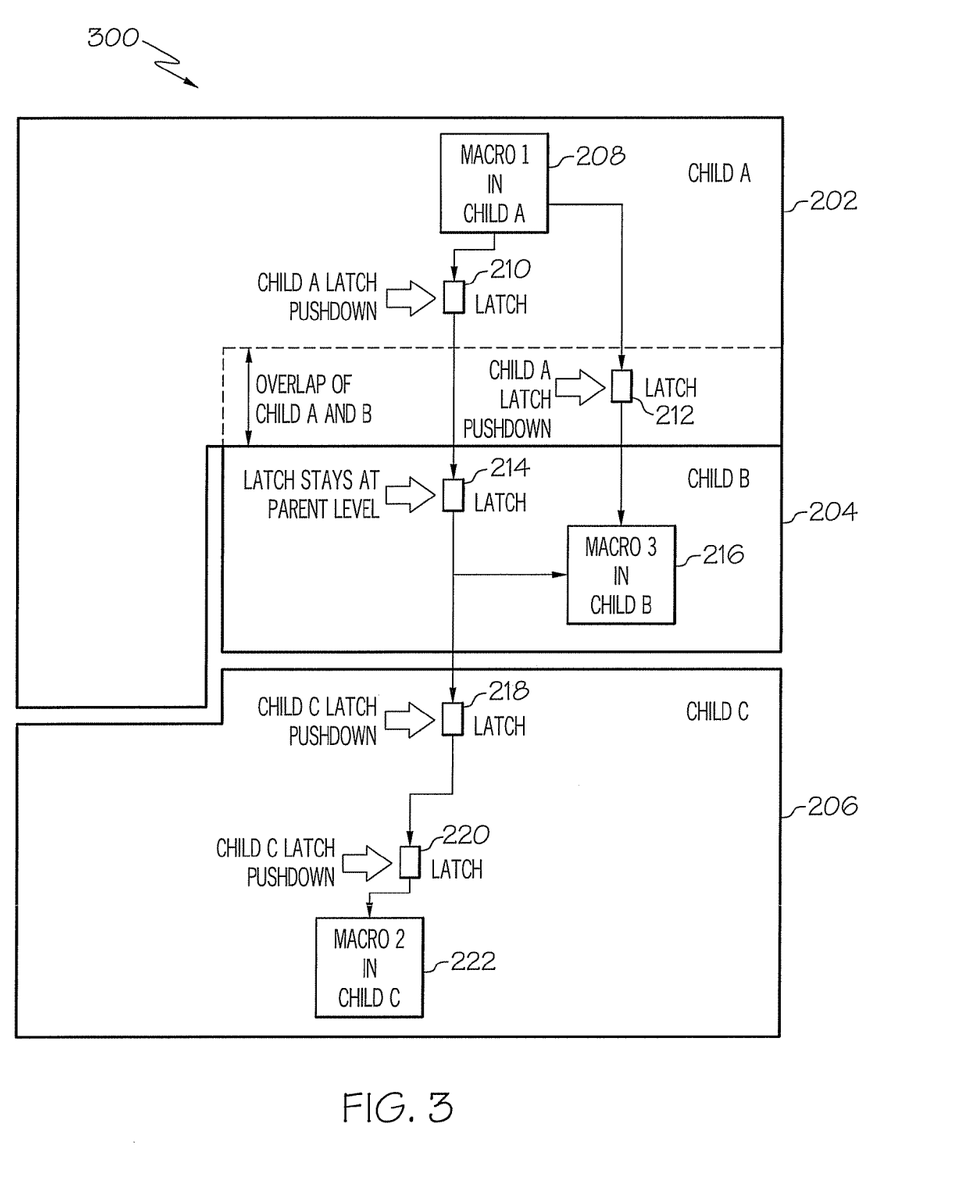
FIG. 3 depicts a further exemplary hierarchical structure upon which hierarchical integrated circuit repartitioning may be performed.

Turning now to FIG. 3, an exemplary hierarchical structure 300 of a parent level, child level, and grandchild level for a hierarchical integrated circuit design is depicted as a top view. In an exemplary embodiment, the hierarchical structure 300 is equivalent to the hierarchical structure 200 of FIG. 2, as previously described, with the exception that a user-defined extension of the physical coverage area of the child A 202 results in an overlap with the physical coverage area of the child B 204. The latch 212 exists in the physical coverage area of both the child A 202 and the child B 204, but the latch 212 can only be pushed down into one of the two potential children.

In an exemplary embodiment, the HICRT 114 of FIG. 1 performs identification and tracing for the latch 212, as previously described, to verify that the latch 212 is a candidate for pushing down into either the child A 202 or the child B 204. Upon confirming that a conflict does exit, the HICRT 114 of FIG. 1 may calculate a furthest distance between the common interconnecting element that is identified within the physical coverage area of more than one child, i.e., the latch 212, and each overlapping child A and B (202 and 204). The distance may be calculated as a Manhattan distance using coordinates for the latch 212 and each child A and B (202 and 204) as derived from the design data 110 of FIG. 1. In the example depicted in FIG. 3, even though the latch 212 is initially identified as a pushdown candidate for both the child A 202 and the child B 204, upon calculating the distances, the HICRT 114 of FIG. 1 may determine that the distance between the latch 212 and the macro one 208 is greater than the distance between the latch 212 and the macro three 216, resulting in retaining the identification of the latch 212 relative to the child A 202, but removing the identification relative to the child B 204. Therefore, the latch 212 can be pushed down into the child A 202 rather than the child B 204. Through selecting the furthest distance as the winner in a conflicting pushdown between children, the corresponding signal path length is reduced, which may improve timing margin and signal strength upon the pushdown Turning now to FIG. 4, a process 400 for hierarchical integrated circuit repartitioning will now be described in accordance with an exemplary embodiment in reference to the system 100 of FIG. 1. In an exemplary embodiment, the host system 102 executes the HICRT 114 to repartition a hierarchical integrated circuit design embodied in the design data 110 on the data storage device 108 in response to a request from a user of the user systems 104. The hierarchical integrated circuit design includes a parent level with one or more the interconnecting elements that connect to at least one child on a child level. The one or more interconnecting elements may be at least one of a latch, a buffer, and a clocking structure. In an exemplary embodiment, each child connected to an interconnecting element includes a driving or receiving circuit. A user may invoke the HICRT 114 to identify one or more interconnecting elements at the parent level along with associated placement data.

Figure 4:
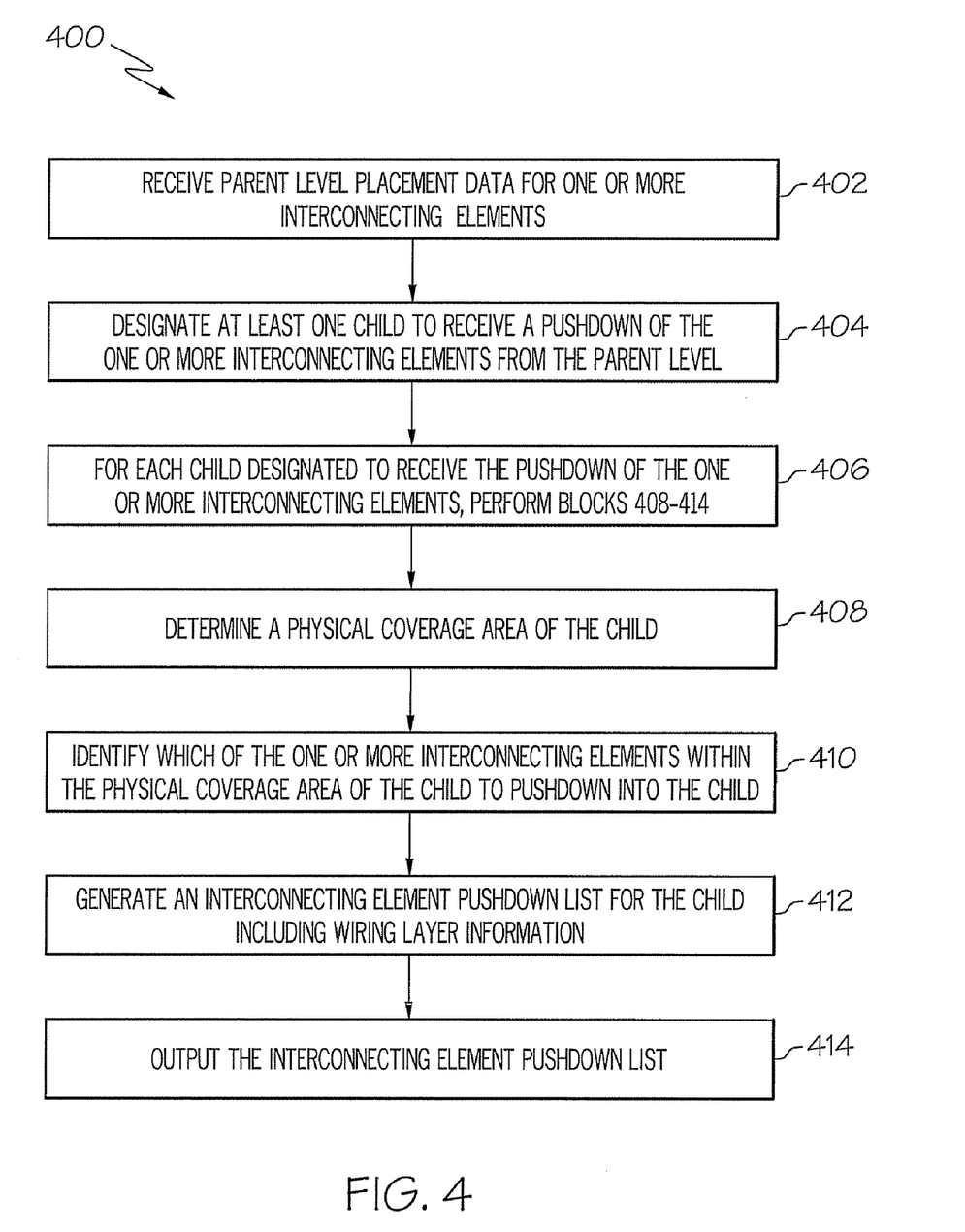
FIG. 4 depicts an exemplary process flow for hierarchical integrated circuit repartitioning.

At block 402, the HICRT 114 receives parent level placement data for one or more interconnecting elements. At block 404, the HICRT 114 designates at least one child to receive a pushdown of the one or more interconnecting elements from the parent level. The designation may be based on user-defined input targeting specific children.

At block 406, the HICRT 114 performs steps included in blocks 408-414, for each child designated to receive the pushdown of the one or more interconnecting elements. At block 408, the HICRT 114 determines a physical coverage area of the child. The physical coverage area may be expanded by a user-defined amount to include interconnecting elements that partially overlap a child or are in close proximity to the child. The coverage area for each child may overlap each other.

At block 410, the HICRT 114 identifies which of the one or more interconnecting elements within the physical coverage area of the child to pushdown into the child. For each interconnecting element, the HICRT 114 verifies that the child is the only non-interconnecting element connection upon a trace backward from the interconnecting element input or forward from the interconnecting element output to identify the interconnecting element. Using a tracing approach prevents pushing down an interconnecting element that includes multiple input or output connections, which could adversely impact signal integrity and add connections to the child that previously did not exist. For example, if an interconnecting element that receives input from two children is pushed down into one of the two children, the child receiving the pushdown would require in an additional input connection to accommodate the signal from the second child, which may be a less efficient result than keeping the interconnecting element at the parent level.

The HICRT 114 encounters an additional issue when more than one child identifies a common interconnecting element. In an exemplary embodiment, for each common interconnecting element identified with more than one child, the HICRT 114 calculates a furthest distance between the common interconnecting element and the more than one child, retaining the identification for the common interconnecting element with the furthest distance, and removing the identification for all of the common interconnecting elements except for the common interconnecting element with the furthest distance. Thus, the HICRT 114 pushes down the common interconnecting element into only one child, selecting the child that provides the greatest potential benefit through reducing the furthest connection distance. The distance may be calculated as a Manhattan distance using coordinates for the common interconnecting element and each child as derived from the design data 110.

At block 412, the HICRT 114 generates an interconnecting element pushdown list for the child, including wiring layer information. The generating of the pushdown list may include reporting a number of interconnecting elements to pushdown, and determining a connection definition between net names for the parent level and the child level. The connection definition may include wire codes and other routing information. Each connecting pin at the child level may be analyzed to determine changes required for including pushed down interconnecting elements. The wiring layer information may include wiring layer and wiring width data used at the parent level for the one or more interconnecting elements.

At block 414, the HICRT 114 outputs the interconnecting element pushdown list. The output may be formatted as files or data for storage in the data storage device 108 as the output files 112. In an exemplary embodiment, a pushdown list is created for each child that receives at least one pushdown. In an alternative exemplary embodiment, a shared pushdown list is created for all children receiving at least one pushdown. The HICRT 114 may also determine whether any of the identified one or more interconnecting elements are part of a bus, and report a partial bus pushdown when fewer than all interconnecting elements of the bus are pushed down into a common child. The HICRT 114 may block the partial bus pushdown or pushdown all interconnecting elements of the bus into the common child. In an alternate exemplary embodiment, a user makes a determination as to whether the partial bus pushdown should be prevented by moving the pushed down interconnecting elements of the bus back to the parent level, or pushing down all of the interconnecting elements of the bus into the common child. Keeping all of the interconnecting elements of the bus at the parent level or in the common child may simplify simulation and verification tasks, as well as provide more consistent timing for parallel signals.

Technical effects may include repartitioning the location of interconnecting elements between parent and child levels in hierarchical integrated circuit design. An advantage includes flexibility of interconnecting element placement, e.g., a latch can be placed in either the parent level or child level of a hierarchical integrated circuit design. Moving an interconnecting element from the parent level to the child level may improve freedom in choosing both the wiring layers and the path to the edge of its boundary. Since a parent entity may have very little silicon reservation inside of a child entity, as well as limited use of lower level metal where interconnecting elements are placed and routed, the present invention enables more efficient allocation of physical resources within a hierarchical integrated circuit design. Moreover, placing an interconnecting element at the same level as an associated driver or receiver circuit may reduce wire length and improve signal-timing margin.

As described above, embodiments can be embodied in the form of computer-implemented processes and apparatuses for practicing those processes. In an exemplary embodiment, the invention is embodied in computer program code executed by one or more network elements. Embodiments include computer program code containing instructions embodied in tangible media, such as floppy diskettes, CD-ROMs, hard drives, universal serial bus (USB) drives, or any other computer-readable storage medium, wherein, when the computer program code is loaded into and executed by a computer, the computer becomes an apparatus for practicing the invention. Embodiments include computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

What is claimed is:

1. A method for hierarchical integrated circuit repartitioning, comprising:
    receiving parent level placement data from a computer for one or more interconnecting elements;
    designating at least one child on a child level by using the computer to receive a pushdown of the one or more interconnecting elements from the parent level, the parent level physically stacked on the child level forming a three-dimension physical structure; and
    performing for each child designated to receive the pushdown of the one or more interconnecting elements:
        determining a physical coverage area of the child;
        identifying which of the one or more interconnecting elements within the physical coverage area of the child to pushdown into the child via tracing between the child and each interconnecting element within the physical coverage area of the child to verify that the child is the only non-interconnecting element connected to one of an input and an output of each interconnecting element, wherein the verifying results in interconnecting element identification;
        generating an interconnecting element pushdown list for the child, including wiring layer information; and
        outputting the interconnecting element pushdown list performing for each common interconnecting element that is identified within the physical coverage area of more than one child;
        calculating a furthest distance between the common interconnecting element and the more than one child;
        retaining the identification for the common interconnecting element with the furthest distance; and
        removing the identification for all of the common interconnecting elements except for the common interconnecting element with the furthest distance.

2. The method of claim 1 further comprising:
    identifying the one or more interconnecting elements at the parent level.

3. The method of claim 1 wherein generating an interconnecting element pushdown list farther comprises:

reporting a number of interconnecting elements to pushdown; and determining a connection definition between net names for the parent level and the child level.

4. The method of claim 1 wherein the wiring layer information further includes wiring layer and wiring width data used at the parent level for the one or more interconnecting elements.

5. The method of claim 1 further comprising:

determining whether any of the identified one or more interconnecting elements are part of a bus; and reporting a partial bus pushdown when fewer than all interconnecting elements of the bus are pushed down into a common child.

6. The method of claim 5 further comprising:

blocking the partial bus pushdown.

7. The method of claim 5 further comprising:

pushing down all interconnecting elements of the bus into the common child.

8. The method of claim 1 wherein the one or more interconnecting elements are at least one of a latch, a buffer, and a clocking structure.

9. A method for hierarchical integrated circuit repartitioning, comprising:

receiving parent level placement data from a computer for one or more interconnecting elements;

designating at least one child on a child level by using the computer to receive a pushdown of the one or more interconnecting elements from the parent level, the parent level physically stacked on the child level forming a three-dimension physical structure; and performing for each child designated to receive the pushdown of the one or more interconnecting elements:

determining a physical coverage area of the child;

expanding the physical coverage area of the child by a user-defined amount;

identifying which of the one or more interconnecting elements within the physical coverage area of the child to pushdown into the child via tracing between the child and each interconnecting element within the physical coverage area of the child to verify that the child is the only non-interconnecting element connected to one of an input and an output of each interconnecting element, wherein the verifying results in interconnecting element identification;

generating an interconnecting element pushdown list for the child, including wiring layer information;

determining whether any of the identified one or more interconnecting elements are part of a bus;

reporting a partial bus pushdown when fewer than all interconnecting elements of the bus are pushed down into a common child; and outputting the interconnecting element pushdown list performing for each common interconnecting element that is identified within the physical coverage area of more than one child;

calculating a farthest distance between the common interconnecting element and the more than one child;

retaining the identification for the common interconnecting element with the furthest distance; and removing the identification for all of the common interconnecting elements except for the common interconnecting element with the furthest distance.

10. A system for hierarchical integrated circuit repartitioning, comprising:

a data storage device holding design data for a hierarchical integrated circuit; and a host system in communication with the data storage device, the host system executing a hierarchical integrated circuit repartitioning tool (HICRT), the HICRT performing:

receiving parent level placement data from a computer for one or more interconnecting elements from the design data;

designating at least one child on a child level by using the computer to receive a pushdown of the one or more interconnecting elements from the parent level, the parent level physically stacked on the child level forming a three-dimension physical structure; and performing for each child designated to receive the pushdown of the one or more interconnecting elements:

determining a physical coverage area of the child;

identifying which of the one or more interconnecting elements within the physical coverage area of the child to pushdown into the child via tracing between the child and each interconnecting element within the physical coverage area of the child to verify that the child is the only non-interconnecting element connected to one of an input and an output of each interconnecting element, wherein the verifying results in interconnecting element identification;

generating an interconnecting element pushdown list for the child, including wiring layer information; and outputting the interconnecting element pushdown list performing for each common interconnecting element that is identified within the physical coverage area of more than one child;

calculating a farthest distance between the common interconnecting element and the more than one child;

retaining the identification for the common interconnecting element with the farthest distance; and removing the identification for all of the common interconnecting elements except for the common interconnecting element with the furthest distance.

11. The system of claim 10 wherein generating an interconnecting element pushdown list farther comprises:

reporting a number of interconnecting elements to pushdown; and determining a connection definition between net names for the parent level and the child level.

12. The system of claim 10 the HICRT further performs:

determining whether any of the identified one or more interconnecting elements are part of a bus; and reporting a partial bus pushdown when fewer than all interconnecting elements of the bus are pushed down into a common child.

13. The system of claim 10 wherein the HICRT further performs at least one of:

blocking the partial bus pushdown; and pushing down all interconnecting elements of the bus into the common child.

14. A computer program product for hierarchical integrated circuit repartitioning, the computer program product comprising:

a storage medium readable by a processing circuit and storing instructions for execution by the processing circuit for implementing a method, the method comprising:

receiving parent level placement data for one or more interconnecting elements;

designating at least one child on a child level to receive a pushdown of the one or more interconnecting elements from the parent level, the parent level physically stacked on the child level forming a three-dimension physical structure; and performing for each child designated to receive the pushdown of the one or more interconnecting elements:

determining a physical coverage area of the child;

identifying which of the one or more interconnecting elements within the physical coverage area of the child to pushdown into the child via tracing between the child and each interconnecting element within the physical coverage area of the child to verify that the child is the only non-interconnecting element connected to one of an input and an output of each interconnecting element, wherein the verifying results in interconnecting element identification;

generating an interconnecting element pushdown list for the child, including wiring layer information; and outputting the interconnecting element pushdown list performing for each common interconnecting element that is identified within the physical coverage area of more than one child;

calculating a furthest distance between the common interconnecting element and the more than one child;

retaining the identification for the common interconnecting element with the furthest distance; and removing the identification for all of the common interconnecting elements except for the common interconnecting element with the furthest distance.

\* \* \* \* \*